US012002267B2

(12) United States Patent
Trilling et al.

(10) Patent No.: US 12,002,267 B2
(45) Date of Patent: Jun. 4, 2024

(54) METHODS, SYSTEMS, AND MEDIA FOR SIMULATING MOVEMENT DATA OF PEDESTRIANS IN A DISTRICT

(71) Applicant: Google LLC, Mountain View, CA (US)

(72) Inventors: Samara Trilling, New York, NY (US); Tess Bianchi, New York, NY (US); Douwe Osinga, New York, NY (US); Josh Chappell, New York, NY (US); Okalo Ikhena, New York, NY (US)

(73) Assignee: Google LLC, Mountain View, CA (US)

( * ) Notice: Subject to any disclaimer, the term of this patent is extended or adjusted under 35 U.S.C. 154(b) by 419 days.

(21) Appl. No.: 17/497,496

(22) Filed: Oct. 8, 2021

(65) Prior Publication Data
US 2022/0114372 A1 Apr. 14, 2022

Related U.S. Application Data

(60) Provisional application No. 63/089,689, filed on Oct. 9, 2020.

(51) Int. Cl.
*G06V 20/52* (2022.01)
*G01C 21/00* (2006.01)
*G06V 20/17* (2022.01)

(52) U.S. Cl.
CPC ......... *G06V 20/53* (2022.01); *G01C 21/3867* (2020.08); *G01C 21/3874* (2020.08); *G06V 20/17* (2022.01)

(58) Field of Classification Search
CPC ........ G06V 20/53; G06V 20/17; G06V 20/54; G01C 21/3867; G01C 21/3874
See application file for complete search history.

(56) References Cited

U.S. PATENT DOCUMENTS 9,870,629 B2 1/2018 Cardno et al.
2008/0106599 A1* 5/2008 Liu .................. G06T 7/246
348/143

(Continued)

OTHER PUBLICATIONS

International Search Report and Written Opinion for International Application No. PCT/US2021/054217 dated Jan. 25, 2022. 19 pages.

(Continued)

*Primary Examiner* — Jianxun Yang
(74) *Attorney, Agent, or Firm* — Lerner David LLP (57) ABSTRACT

Methods, systems, and media for simulating movement data of pedestrians in a district are provided. The method comprises: receiving a district plan for a proposed district; determining a number of users that would populate a building in the proposed district; generating a population of simulated users based on the determined number of users that would populate the building in the proposed district; assigning, for the population of simulated users in the building, groups of simulated users in the population of simulated users to a movement category from a plurality of movement categories; distributing, for the groups of simulated users assigned to each of the plurality of movement categories, a group of simulated users to a first destination within the proposed district that satisfies the movement category by determining a probable walking path from the building to the first destination; in response to determining that the first destination within the proposed district has reached a first capacity threshold, distributing remaining users from the group of simulated users to a second destination within the proposed district that satisfies the movement category until at least one of the remaining users in the movement category has been distributed and the second destination within the proposed district has reached a second capacity threshold; distributing, for the groups of simulated (Continued)

users assigned to each of the plurality of movement categories, trips having the probable walking path of the group of simulated users over time by applying a distribution function to each of the plurality of movement categories; and causing a map representation of the proposed district to be presented, wherein the map representation highlights each of the trips having the probable walking path distributed over time to indicate predicted levels of congestion at a particular time in the proposed district.

21 Claims, 5 Drawing Sheets

(56) References Cited

U.S. PATENT DOCUMENTS

| | | | |
|---|---|---|---|
| 2014/0149094 A1* | 5/2014 | Takeuchi | G06V 20/53 |
| | | | 703/6 |
| 2019/0286766 A1 | 9/2019 | Yoshida | |

OTHER PUBLICATIONS

International Preliminary Report on Patentability for International Application No. PCT/US2021/054217 dated Apr. 20, 2023. 11 pages.

* cited by examiner

METHODS, SYSTEMS, AND MEDIA FOR SIMULATING MOVEMENT DATA OF PEDESTRIANS IN A DISTRICT

CROSS-REFERENCE TO RELATED APPLICATIONS

This application claims the benefit of U.S. Provisional Patent Application No. 63/089,689, filed Oct. 9, 2020, which is hereby incorporated by reference herein in its entirety.

TECHNICAL FIELD

The disclosed subject matter relates to methods, systems, and media for simulating movement data of pedestrians in a district.

BACKGROUND

When designing a new neighborhood, planners, architects, and developers must weigh a wide range of competing objectives that impact quality of life. For example, increased density can generate more jobs and more housing options, but it can also mean more foot traffic congestion. While knowledge of pedestrian travel behavior can be important, many approaches use data to model the individual behavior of every person in a district, which presents privacy concerns. For example, one approach uses hidden Markov models to infer the trip purpose of individuals living in a district from data extracted from network carrier mobile phone usage logs, such as call detail records. Another approach merges mobile location based services (LBS) data with fleet GPS data to generate mobility patterns of individuals living within a district.

Accordingly, it is desirable to provide new methods, systems, and media for simulating movement data of pedestrians in a district.

SUMMARY

Methods, systems, and media for simulating movement data of pedestrians in a district are provided.

In accordance with some embodiments of the disclosed subject matter, a method for pedestrian movement simulation in districts is provided, the method comprising: receiving, using a hardware processor, a district plan for a proposed district; determining, using the hardware processor, a number of users that would populate a building in the proposed district; generating, using the hardware processor, a population of simulated users based on the determined number of users that would populate the building in the proposed district; assigning, using the hardware processor, for the population of simulated users in the building, groups of simulated users in the population of simulated users to a movement category from a plurality of movement categories; distributing, using the hardware processor, for the groups of simulated users assigned to each of the plurality of movement categories, a group of simulated users to a first destination within the proposed district that satisfies the movement category by determining a probable walking path from the building to the first destination; in response to determining that the first destination within the proposed district has reached a first capacity threshold, distributing, using the hardware processor, remaining users from the group of simulated users to a second destination within the proposed district that satisfies the movement category until at least one of the remaining users in the movement category has been distributed and the second destination within the proposed district has reached a second capacity threshold; distributing, using the hardware processor, for the groups of simulated users assigned to each of the plurality of movement categories, trips having the probable walking path of the group of simulated users over time by applying a distribution function to each of the plurality of movement categories; and causing, using the hardware processor, a map representation of the proposed district to be presented, wherein the map representation highlights each of the trips having the probable walking path distributed over time to indicate predicted levels of congestion at a particular time in the proposed district.

In some embodiments, the number of users that would populate the building in the proposed district is determined by retrieving unit type information from the received district plan and assigning an estimated unit occupancy for each unit type of the building based on location information associated with the proposed district.

In some embodiments, the number of users that would populate the building in the proposed district is determined by comparing a first set of characteristics associated with the proposed district to sets of characteristics associated with existing districts and assigning the number of users based on an existing district having characteristics similar to the first set of characteristics.

In some embodiments, the movement category includes at least one of a work activity type, a recreational activity type, an errand activity type, and a cultural activity type.

In some embodiments, the group of simulated users are distributed to the first destination within the proposed district using a gravity model that determines a plurality of destinations for each of the plurality of movement categories that the group of simulated users is likely to visit and the first destination is selected from the plurality of destinations based on having a shortest walking path from the building. In some embodiments, the gravity model retrieves, for the proposed district, geographic information that impacts pedestrian trips and selects the first destination from the plurality of destinations based on the walking path from the building and based on the geographic information that impacts pedestrian trips.

In some embodiments, the method further comprises assigning a visual characteristic to each user in the group of simulated users for the movement category, wherein the probable walking path of each user in the group of simulated users is indicated on the map representation with the visual characteristic.

In accordance with some embodiments of the disclosed subject matter, a system for pedestrian movement simulation in districts is provided, the system comprising a hardware processor that is configured to: receives a district plan for a proposed district; determines a number of users that would populate a building in the proposed district; generates a population of simulated users based on the determined number of users that would populate the building in the proposed district; assigns, for the population of simulated users in the building, groups of simulated users in the population of simulated users to a movement category from a plurality of movement categories; distributes, for the groups of simulated users assigned to each of the plurality of movement categories, a group of simulated users to a first destination within the proposed district that satisfies the movement category by determining a probable walking path from the building to the first destination; in response to determining that the first destination within the proposed district has reached a first capacity threshold, distributes remaining users from the group of simulated users to a second destination within the proposed district that satisfies the movement category until at least one of the remaining users in the movement category has been distributed and the second destination within the proposed district has reached a second capacity threshold; distributes, for the groups of simulated users assigned to each of the plurality of movement categories, trips having the probable walking path of the group of simulated users over time by applying a distribution function to each of the plurality of movement categories; and causes a map representation of the proposed district to be presented, wherein the map representation highlights each of the trips having the probable walking path distributed over time to indicate predicted levels of congestion at a particular time in the proposed district.

In accordance with some embodiments of the disclosed subject matter, a non-transitory computer-readable medium containing computer executable instructions that, when executed by a processor, cause the processor to perform a method for pedestrian movement simulation in districts is provided, the method comprising: receiving a district plan for a proposed district; determining a number of users that would populate a building in the proposed district; generating a population of simulated users based on the determined number of users that would populate the building in the proposed district; assigning, for the population of simulated users in the building, groups of simulated users in the population of simulated users to a movement category from a plurality of movement categories; distributing, for the groups of simulated users assigned to each of the plurality of movement categories, a group of simulated users to a first destination within the proposed district that satisfies the movement category by determining a probable walking path from the building to the first destination; in response to determining that the first destination within the proposed district has reached a first capacity threshold, distributing remaining users from the group of simulated users to a second destination within the proposed district that satisfies the movement category until at least one of the remaining users in the movement category has been distributed and the second destination within the proposed district has reached a second capacity threshold; distributing, for the groups of simulated users assigned to each of the plurality of movement categories, trips having the probable walking path of the group of simulated users over time by applying a distribution function to each of the plurality of movement categories; and causing a map representation of the proposed district to be presented, wherein the map representation highlights each of the trips having the probable walking path distributed over time to indicate predicted levels of congestion at a particular time in the proposed district.

In accordance with some embodiments of the disclosed subject matter, a system for pedestrian movement simulation in districts is provided, the system comprising: means for receiving a district plan for a proposed district; means for determining a number of users that would populate a building in the proposed district; means for generating a population of simulated users based on the determined number of users that would populate the building in the proposed district; means for assigning, for the population of simulated users in the building, groups of simulated users in the population of simulated users to a movement category from a plurality of movement categories; means for distributing, for the groups of simulated users assigned to each of the plurality of movement categories, a group of simulated users to a first destination within the proposed district that satisfies the movement category by determining a probable walking path from the building to the first destination; in response to determining that the first destination within the proposed district has reached a first capacity threshold, means for distributing remaining users from the group of simulated users to a second destination within the proposed district that satisfies the movement category until at least one of the remaining users in the movement category has been distributed and the second destination within the proposed district has reached a second capacity threshold; means for distributing, for the groups of simulated users assigned to each of the plurality of movement categories, trips having the probable walking path of the group of simulated users over time by applying a distribution function to each of the plurality of movement categories; and means for causing a map representation of the proposed district to be presented, wherein the map representation highlights each of the trips having the probable walking path distributed over time to indicate predicted levels of congestion at a particular time in the proposed district.

BRIEF DESCRIPTION OF THE DRAWINGS

Various objects, features, and advantages of the disclosed subject matter can be more fully appreciated with reference to the following detailed description of the disclosed subject matter when considered in connection with the following drawings, in which like reference numerals identify like elements.

DETAILED DESCRIPTION

In accordance with various embodiments, mechanisms (which can include methods, systems, and media) for simulating movement data of a district are provided.

In some embodiments, the mechanisms described herein can receive a district design or plan and can predict the street activity or movement data of pedestrians within the district. More particularly, the mechanisms described herein can, based on a proposed district plan, determine the predicted destinations to perform a particular category of activities for the people that would populate the proposed district using a gravity model and can determine the popularity of performing the particular category of activities over time using a distribution function.

In some embodiments, for a received district plan (such as one created using a generative design system), the mechanisms can determine a number of users that would populate the proposed district. For example, the mechanisms can determine, for a particular residential building, a number of occupants that would occupy the building. In a more particular example, in response to determining that the building has a particular mix of apartment units (e.g., 100 studio apartments, 50 one-bedroom apartments, and 50 two-bedroom apartments) and in response to determining an estimated unit occupancy for a particular geographic location (e.g., 1.2 persons occupy a studio apartment, 1.8 persons occupy a one-bedroom apartment, and 3.5 persons occupy a two-bedroom apartment), the mechanisms can estimate that the building has 385 occupants to distribute through the district. In continuing this example, the mechanisms can assign groups of users from the 385 occupants to particular movement categories for a particular time of the day (e.g., 80% of these occupants will travel from the residential building to a nearby office building at around 9 AM on weekdays). Alternatively, based on the number of users that would populate an individual building or the proposed district, the mechanisms can create a number of simulated users and can assign each of the simulated users to a particular movement category for a particular time of the day (e.g., a work activity type, a recreation activity type, an errand activity type, a cultural activity type, etc.).

Upon assigning populations at various locations within a proposed district to a particular movement category for a particular time of each day, the mechanisms can distribute the population or group of users to a particular destination that satisfies the assigned movement category by determining a probable walking path from a starting point of the group of users (e.g., a residential address in the district) to the particular destination (e.g., a nearby office building for a work-related activity). For example, the mechanisms can use a gravity model that determines which destinations for each movement category that the group of users is likely to visit. In a more particular example, the mechanisms can, using the gravity model, select the closest destination that satisfies the assigned movement category (e.g., the closest office building).

The mechanisms can continue distributing the group of users assigned to the particular movement category until a particular destination has reached its capacity or until the group of users assigned to the particular movement category for that particular time has been distributed. If, for example, a particular destination has reached its capacity (e.g., a maximum occupancy of an office building for a work-related activity, a certain number of desks in an office building for a work-related activity, etc.), the mechanisms can continue to distribute each of the remaining users to a next destination determined by the gravity model, such as the next nearest commercial building for a work-related activity, until that particular destination has reached its capacity or until all of the users in the group of users assigned to the particular movement category for that particular time has been distributed. Accordingly, this can, for example, provide the mechanisms with the maximum number of trips that are occurring at a given time.

It should be noted, however, that all of these trips may not happen at the same time. As such, in some embodiments, the mechanisms can distribute each of the trips over time by constructing a distribution function that represents the portion of users in a particular movement category that will be traveling at a particular time. That is, the distribution function can reflect the popularity of a particular movement category over a particular time period (e.g., every hour for each day of the week). For example, using a multimodal Gaussian function, a portion of the users in the group of users from a particular location (e.g., 80% of the users that reside in a residential building) can be assigned to a particular movement category (e.g., a work activity type) for a particular time of the day (e.g., 9 AM and 5 PM). In continuing this example, the remaining users from the particular location (e.g., 20% of the remaining users) may be working from home or may otherwise not be assigned to a work activity type. By determining the value of the distribution function at each hour of the day and scaling that number by the maximum number of trips in that movement category, this can, for example, provide the mechanisms with the number of trips that are occurring at a given time over the course of the week.

In some embodiments, the mechanisms can present the predicted street activity or movement data of pedestrians within the district in any suitable approach. For example, the mechanisms can create an augmented map that indicates the streets and/or roads of the street grid and buildings along the street grid in the proposed district plan in connection with predicted levels of pedestrian congestion. In a more particular example, each group of users that has been assigned a particular movement category can be assigned a color based on the particular movement category in which the color can be used to highlight the predicted path between the starting point of the group of users (e.g., the office building) to the predicted destination of the group of users (e.g., the coffee shop) at a particular time. In continuing this example, the portions of the augmented map that are more highlighted with the particular color can illustrate the popularity of a particular path or portion of a path for a particular movement category at a particular time.

These mechanisms can be used in any suitable application. For example, these mechanisms can be used to present a user interface that indicates the likely movement data of pedestrians in a proposed district, where a planner, architect, or developer can determine whether a proposed district may have foot traffic issues. In another example, these mechanisms can be used to present a user interface that indicates the likely movement data of pedestrians when a particular building associated with a particular activity or use type (e.g., a commercial building for a work-related activity) is being considered for constructing in a particular district, where a planner, architect, or developer can determine whether a proposed building may create foot traffic issues for the district. In yet another example, these mechanisms can be used to present a user interface that indicates the likely movement data of pedestrians (e.g., probable walking path and probable activity type) at hourly resolutions over the course of a given week, where a planner, architect, or developer can observe the overall change in foot traffic during business hours on weekdays.

These and other features for simulating movement data of pedestrians in a district are described in connection with FIGS. 1-5.

Figure 1:
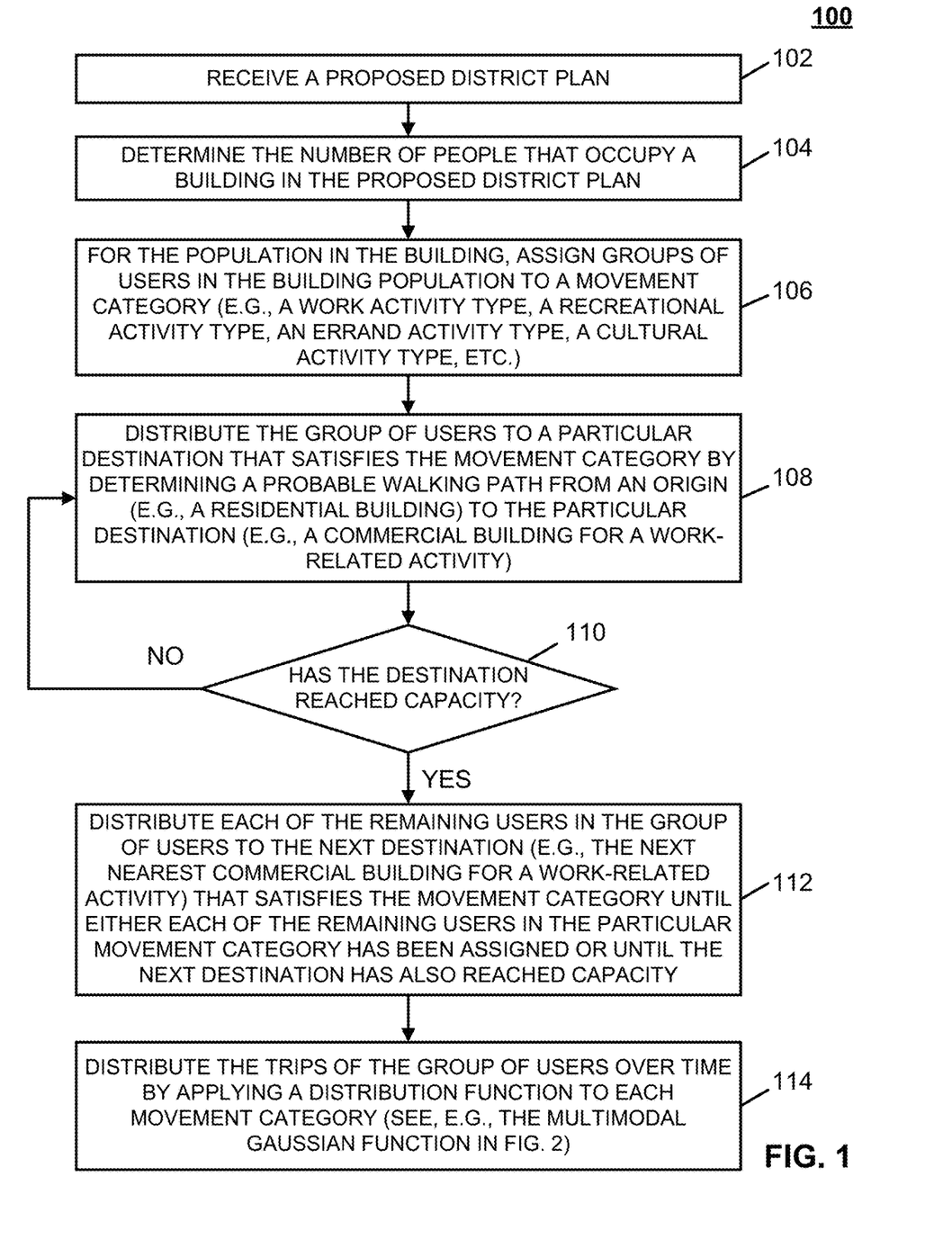
FIG. 1 shows an illustrative example of a process for simulating movement data of pedestrians in a district in accordance with some embodiments of the disclosed subject matter.
Figure 2:
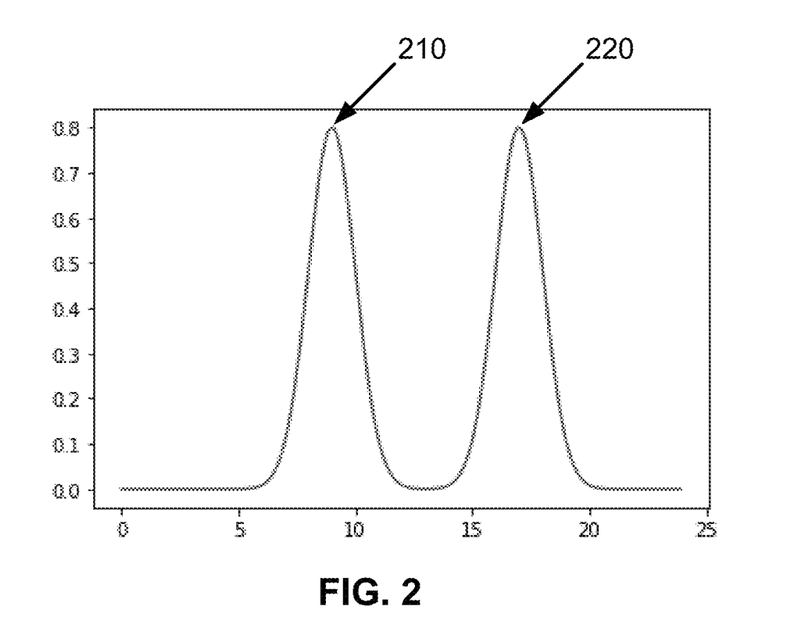
FIG. 2 shows an illustrative example of a multi-modal Gaussian distribution function of simulated users assigned to a work activity type, where the x-axis represents time and the y-axis represents a percentage of the population of the district that is traveling at that time, in accordance with some embodiments of the disclosed subject matter.

Turning to FIG. 1, an illustrative example 100 of a process for simulating movement data of pedestrians in a district is shown in accordance with some embodiments of the disclosed subject matter. In some embodiments, process 100 can be executed by any suitable device such as a server or a user device (e.g., a desktop computer, a laptop computer, and/or any other suitable type of user device). Note that, in some embodiments, in an instance in which blocks of process 100 are executed by a server, any suitable input parameters can be received at the server from a user device (e.g., a proposed district plan). Additionally, in some such embodiments, user interfaces can be presented on the user device.

Figure 3:
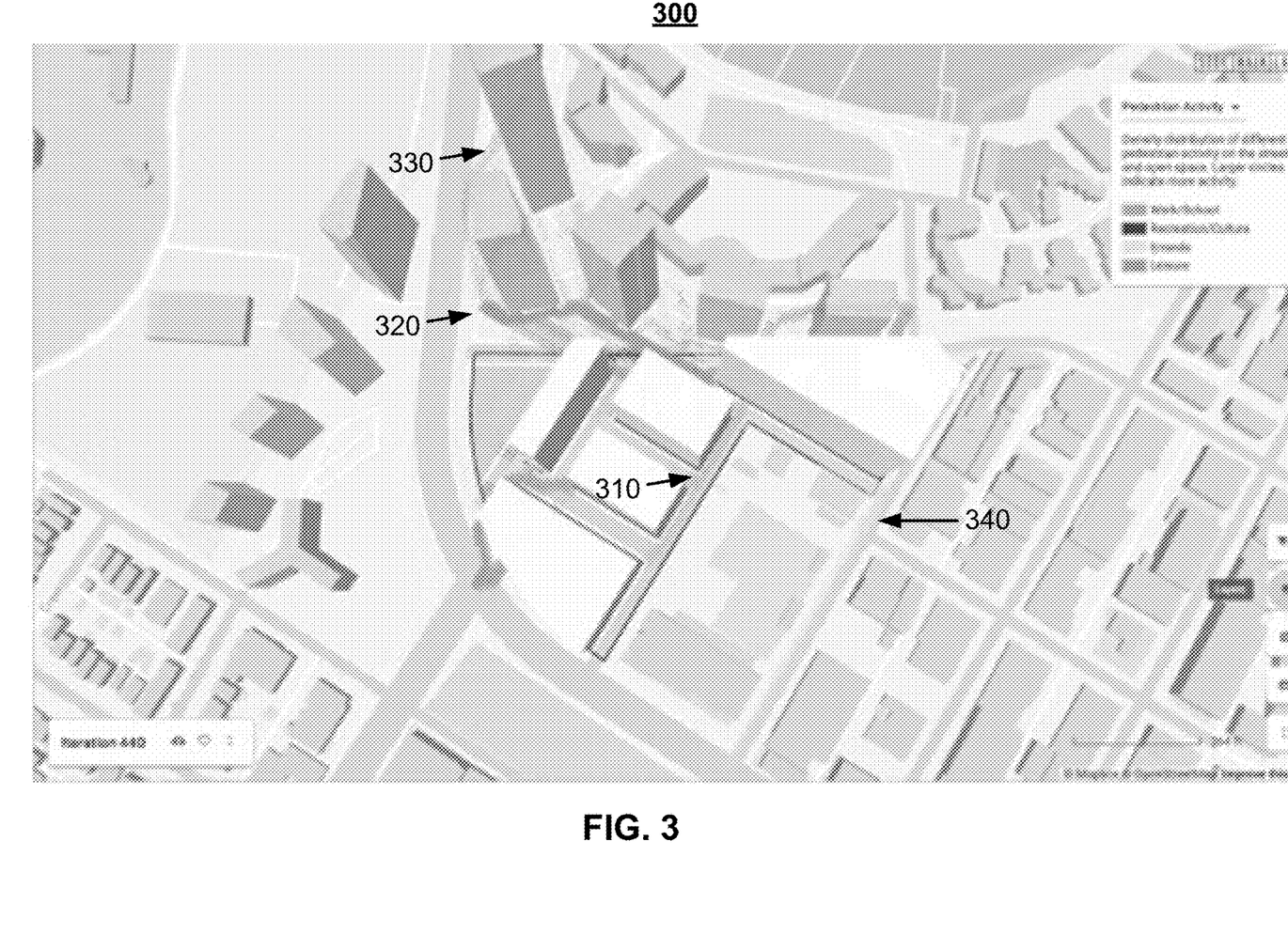
FIG. 3 shows an illustrative example of an augmented map that indicates the streets and/or roads of the street grid and buildings along the street grid in connection with predicted levels of pedestrian congestion in accordance with some embodiments of the disclosed subject matter.

Process 100 can begin by receiving a proposed district plan at 102. For example, FIG. 3 shows an illustrative district plan 300 that can be received. As shown, district plan 300 can include any combination of buildings having different sizes and dimensions and having different uses (e.g., commercial, residential, etc.) and streets in a particular street grid. In addition, the received district plan can include any suitable information about the district, such as general building information (e.g., gross floor area information, number of floors, number of apartments, etc.), building constraint information (e.g., constraints related to a number of types of different units that are to be included in a particular building, criteria for one or more buildings including building shape information, information indicating that a particular number of commercial units are to be included, information indicating that a particular number of studio apartments are to be included, information indicating that a particular number of one-bedroom apartments are to be included, information indicating that a particular number of two-bedroom apartments are to be included, etc.), building use type (e.g., office building, retail store, grocery store, school building, residential building, etc.), street or walking path information, etc.

It should be noted that the received district plan can include any suitable map data corresponding to a geographic location. In some embodiments, the geographic location can correspond to any suitable parcel of land of any suitable size. In some embodiments, the map data can include any suitable information about the geographic location, such as locations of borders, locations of natural landmarks (e.g., rivers, lakes, mountains, etc.), locations of existing infrastructure (e.g., bridges, parks, buildings, etc.), and/or any other suitable information. For example, the map data can include any suitable information about the geographic location that can impact a pedestrian trip (e.g., whether a particular path is uphill or downhill, whether a particular path is shared with vehicles, whether a particular path has a sidewalk and the width of that sidewalk, whether a particular path is one-way for vehicular traffic, etc.). In some embodiments, process 100 can receive the map data from any suitable entity or source. In some embodiments, the map data can be in any suitable format, such as indications of geospatial coordinates of landmarks, and/or in any other suitable format.

It should be noted that, in some embodiments, the proposed district plan can include one or more buildings of a particular activity or use type (e.g., a commercial building for a work-related activity) that is planning to be constructed in an existing district.

At 104, process 100 can determine a number of people that would populate a building (or any other suitable starting location) in the proposed district plan received at 102. For example, based on building use type and gross floor area of buildings in the proposed district plan, process 100 can determine the maximum number of people that can populate the proposed district. In another example, upon determining that the proposed district plan includes residential buildings having a particular number of unit types (e.g., ten residential buildings having a certain number of one-bedroom units, two-bedroom units, and three-bedroom units in the proposed district), process 100 can estimate the maximum number of people that can populate the proposed district based on an estimated occupancy per bedroom in each residential building (e.g., a maximum occupancy of two people per bedroom multiplied by the number of bedrooms in a residential building for each residential building in the proposed district plan). In yet another example, upon determining that a building in a proposed district has a particular mix of apartment units (e.g., 100 studio apartments, 50 one-bedroom apartments, and 50 two-bedroom apartments) and upon determining an estimated unit occupancy for a particular geographic location (e.g., 1.2 persons occupy a studio apartment, 1.8 persons occupy a one-bedroom apartment, and 3.5 persons occupy a two-bedroom apartment), process 100 can estimate that the building in the proposed district has 385 occupants to distribute to one or more destinations through the district. Alternatively, in some embodiments, the proposed district plan can be compared against districts having similar characteristics to estimate the number of people that would populate the proposed district based on the number of people that populate the districts having similar characteristics.

At 106, process 100 can, for the proposed district plan received at 102 and for the population of people that occupy each building in the proposed district plan at 104, assign groups of the users in the building population to a particular movement category for a particular time of the day.

It should be noted that each group of users in the building population can be assigned to any suitable movement category. Movement categories can include, for example, a work activity type (e.g., traveling between a residential starting point and an office building), a recreation activity type (e.g., traveling to a park), an errand activity type (e.g., traveling to a grocery store), or cultural activity type (e.g., traveling to a museum).

It should also be noted that, in some embodiments, a user interface can be presented in which a user can be provided with an opportunity to select one or more defined movement categories from a set of movement categories to assign to each of the groups of users in the building populations of a proposed district. For example, the user may only be interested in observing a simulation of street activity based on a subset of movement categories (e.g., work activity type and errand activity type).

Referring back to FIG. 1, upon assigning each of the groups of users in the building population to a particular movement category for a particular time of each day, process 100 can distribute each of the simulated users to a particular destination that satisfies the assigned movement category at 108. This can be done, for example, by determining a probable walking path from a starting point of the group of users (e.g., a residential address in the district) to the particular destination (e.g., a nearby office building for a work-related activity). For example, process 100 can use a gravity model that determines which destinations for each movement category that the group of users in the building population are likely to visit. In a more particular example, process 100 can, using the gravity model, select the closest destination or the shortest walking path from an origin that satisfies the assigned movement category (e.g., the closest office building). In another example, the gravity model can retrieve geographic information for a particular region that may impact pedestrian trips, such as elevational information to determine whether portions of a pedestrian trip include a steep uphill climb, information to determine that portions of a pedestrian trip share the pathway with vehicular traffic (e.g., which can be used to determine pedestrian comfort), information to determine that portions of a pedestrian trip are windy (e.g., which can also be used to determine pedestrian comfort based on a number of windy paths), etc. In continuing this example, the gravity model that determine a walking path between an origin and a particular destination while accounting for geographic information that may impact a pedestrian trip. Accordingly, based on a proposed district design (e.g., one that was created using a generative design system), process 100 can assign a movement category to different groups of users to estimate what people in the proposed district are likely to do and can create a probability of where users would travel based on determining the shortest path to estimate movement in the proposed district.

Alternatively to 106 and 108 of process 100, in some embodiments, process 100 can create a simulated user for each person that would populate the proposed district plan and can assign each of the simulated users to a particular movement category for a particular time of the day. For example, each simulated user can be assigned to any suitable movement category and upon assigning each of the simulated users to a particular movement category for a particular time of each day, process 100 can distribute each of the simulated users to a particular destination that satisfies the assigned movement category. This can be done, for example, by determining a probable walking path from a starting point of the simulated user (e.g., a residential address in the district) to the particular destination (e.g., a nearby office building for a work-related activity). For example, process 100 can use a gravity model that determines which destinations for each movement category that the simulated users are likely to visit. In a more particular example, process 100 can, using the gravity model, select the closest destination or the shortest walking path from an origin that satisfies the assigned movement category (e.g., the closest office building). Accordingly, based on a proposed district design (e.g., one that was created using a generative design system), process 100 can assign a movement category to each simulated user to estimate what people in the proposed district are likely to do and can create a probability of where each simulated user would travel based on determining the shortest path to estimate movement in the proposed district.

Referring back to FIG. 1, at 110, process 100 can continue to distribute a group of users assigned to the particular movement category until a particular destination has reached its capacity or until the users in the group of users assigned to the particular movement category for that particular time has been distributed. If, for example, a particular destination has not reached its capacity at 110, process 100 can return to 108 and continue to distribute another group of users in a building population from the origin to another particular destination (e.g., a group of users in the building population that are students and are to be distributed to nearby schools, a group of users in the building population that run an errand at a particular time and visit a grocery store, and so on). If, for example, a particular destination has reached its capacity at 110 (e.g., a maximum occupancy of an office building for a work-related activity, a certain number of desks in an office building for a work-related activity, etc.), process 100 can, at 112, continue to distribute each of the remaining users in the group of users to a next destination determined by the gravity model, such as the next nearest commercial building for a work-related activity, until that particular destination has reached its capacity or until each of the simulated users assigned to the particular movement category for that particular time has been distributed. Accordingly, this can, for example, determine the maximum number of trips that are occurring at a given time.

It should be noted, however, that all of these trips may not happen at the same time. As such, in some embodiments, process 100 can distribute each of the trips over time by constructing a distribution function that represents the portion of simulated users in a particular movement category that will be traveling at a particular time at 114. For example, using a multimodal Gaussian function such as the one shown in FIG. 2, a portion of the population at a particular location (e.g., 80% of the population at a residential building) can be assigned to a particular movement category (e.g., a work activity type) for a particular time of the day (e.g., 9 AM as shown by the peak at 210 of FIG. 2 and 5 PM as shown by the peak at 220 of FIG. 2). In continuing this example, the remaining users in the population (e.g., 20% of the remaining users in the population of a residential building) may be working from home or may otherwise not be assigned to a work activity type. By determining the value of this distribution function at each hour of the day and multiplying that number by the maximum number of trips in that category (as determined using the gravity model in 106-112), process 100 can determine the number of trips that are occurring at a given time over the course of the week.

In response to distributing the group of users at a particular location (e.g., a population of residents that reside at a residential building) at 104 through 114 of process 100, process 100 can loop back to 104 and can determine a population of another building in the proposed district plan. In response to determining that there are no additional starting locations or origins of interest within the proposed district plan, process 100 can present the predicted street activity or movement data of pedestrians within the proposed district plan.

In some embodiments, the predicted street activity or movement data of pedestrians within the proposed district plan can be presented using any suitable approach. For example, upon determining the probable walking path of these groups of users at particular times, an augmented map based on the proposed district plan can be created that indicates the streets and/or roads of the street grid and buildings along the street grid in connection with predicted levels of pedestrian congestion. In a more particular example, as shown in FIG. 3, each group of users from particular origins that has been assigned a particular movement category can be assigned a color to highlight the predicted path between the starting point of the group of users (e.g., the office building) to the predicted destination of the group of users (e.g., the coffee shop) at a particular time. In continuing this example, the portions of the augmented map that are more highlighted with the particular color can illustrate the popularity of a particular path or portion of a path for a particular movement category at a particular time. As shown in FIG. 3, a light blue color can be assigned to movements in the work or school activity type and the highlight path of 310 indicates a popular walking path for those performing a work or school activity type of travel at a particular time. As also shown in FIG. 3, a light red color can be assigned to movement in the leisure activity type in which darker highlighted path 320 indicates a popular walking path for simulated users performing a leisure activity type of travel and in which lighter highlighted path 330 indicates a less popular walking path for simulated users also performing a leisure activity type of travel in the proposed district. As further shown in FIG. 3, a yellow color can be assigned to movement in the errands activity type in which highlighted path 340 indicates a popular walking path for simulated users performing an errand activity type of travel in the proposed district.

As shown in FIG. 3, an augmented map that indicates the streets and/or roads of the street grid and buildings along the street grid in connection with predicted levels of pedestrian congestion can be used in any suitable application. For example, the augmented map can be used to present a user interface that indicates the likely movement data of pedestrians in a proposed district, where a planner, architect, or developer can determine whether a proposed district may have foot traffic issues. In another example, the augmented map can be used to present a user interface that indicates the likely movement data of pedestrians when a particular building associated with a particular activity or use type (e.g., a commercial building for a work-related activity or adding a school building at a particular location) is being considered for constructing at a particular location in a district, where a planner, architect, or developer can determine whether a proposed building may create foot traffic issues for the district. In yet another example, the augmented map can be used to present a user interface that indicates the likely movement data of pedestrians (e.g., probable walking path and probable activity type) at hourly resolutions over the course of a given week, where a planner, architect, or developer can observe the overall change in foot traffic during business hours on weekdays.

Figure 4:
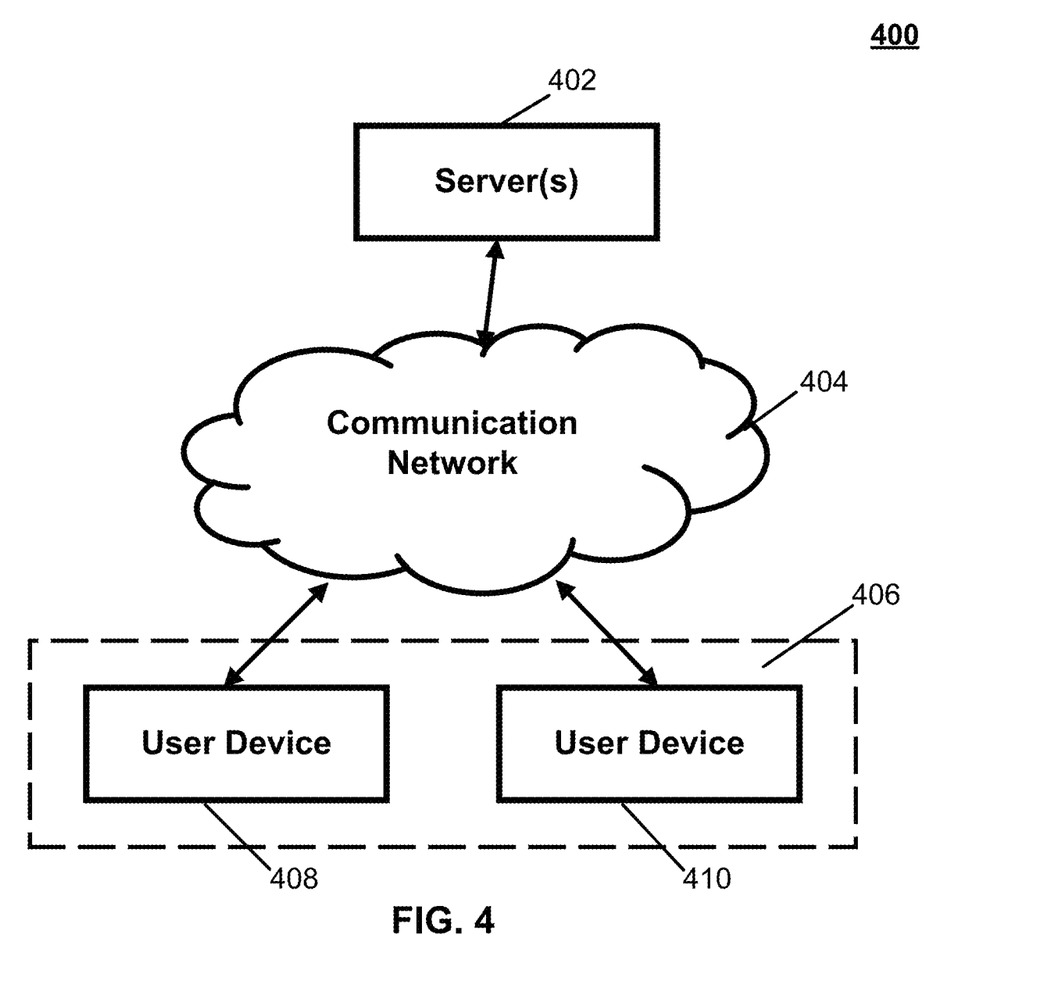
FIG. 4 shows a schematic diagram of an illustrative system suitable for implementation of mechanisms described herein for simulating movement data of pedestrians in a district in accordance with some embodiments of the disclosed subject matter.

Turning to FIG. 4, an example 400 of hardware for simulating movement data of pedestrians in a district that can be used in accordance with some embodiments of the disclosed subject matter is shown. As illustrated, hardware 400 can include a server 402, a communication network 404, and/or one or more user devices 406, such as user devices 408 and 410.

In some embodiments, server 402 can be any suitable server for storing data and/or programs, executing programs (e.g., executing an algorithm to receive a proposed district plan (e.g., that was created using a generative design system), determine an estimated number of people in a proposed district based on the proposed district plan, generate simulated users based on the estimated number of people in the proposed district, assign each of the simulated users to movement categories for particular times, use a gravity model to distribute the simulated users by determining a probable walk path within the proposed district to perform an activity in the movement category, use a distribution function to distribute the trips of the simulated users over different times, and generate an augmented map of the proposed district plan to illustrate the probable walking path and motivations at hourly resolution throughout the course of a week, as described above in connection with FIG. 1), and/or for any other suitable function(s). For example, in some embodiments, server 402 can store geographic information for a particular region, such as locations of water (e.g., lakes, rivers, etc.), geographic borders, topographic information, and/or any other suitable type of geographic information that can be used for generating building layouts. In a more particular example, server 402 can store geographic information for a particular region that may impact pedestrian trips, such as elevational information to determine whether portions of a pedestrian trip include a steep uphill climb, information to determine that portions of a pedestrian trip share the pathway with vehicular traffic (e.g., which can be used to determine pedestrian comfort), information to determine that portions of a pedestrian trip are windy (e.g., which can also be used to determine pedestrian comfort based on a number of windy paths), etc. As another example, in some embodiments, server 402 can store a program used to receive a proposed district plan (e.g., that was created using a generative design system), determine an estimated number of people in a proposed district based on the proposed district plan, generate simulated users based on the estimated number of people in the proposed district, assign each of the simulated users to movement categories for particular times, use a gravity model to distribute the simulated users by determining a probable walk path within the proposed district to perform an activity in the movement category, use a distribution function to distribute the trips of the simulated users over different times, and generate an augmented map of the proposed district plan to illustrate the probable walking path and motivations at hourly resolution throughout the course of a week, as described above in connection with FIG. 1. Note that, in instances in which server 402 executes a program or an algorithm to generate an augmented map of the proposed district plan to provide a simulation of street activities, server 402 can receive any suitable input parameters or instructions from user device 406 (e.g., a proposed district plan, selected movement categories of interest, etc.). In some embodiments, server 402 can be omitted.

Communication network 404 can be any suitable combination of one or more wired and/or wireless networks in some embodiments. For example, communication network 404 can include any one or more of the Internet, an intranet, a wide-area network (WAN), a local-area network (LAN), a wireless network, a digital subscriber line (DSL) network, a frame relay network, an asynchronous transfer mode (ATM) network, a virtual private network (VPN), and/or any other suitable communication network. User devices 406 can be connected by one or more communications links to communication network 404 that can be linked via one or more communications links to server 402. The communications links can be any communications links suitable for communicating data among user devices 406 and server 402, such as network links, dial-up links, wireless links, hard-wired links, any other suitable communications links, or any suitable combination of such links.

User devices 406 can include any one or more user devices suitable for storing data or programs, executing programs, transmitting input parameters or instructions to server 402, presenting user interfaces that indicate building layouts (e.g., as shown in and described above in connection with FIGS. 2A, 2B, 3A, and 3B), and/or for performing any other suitable function(s). For example, in some embodiments, user devices 406 can include a desktop computer, a laptop computer, a mobile phone, a tablet computer, and/or any other suitable type of user device.

Although server 402 is illustrated as one device, the functions performed by server 402 can be performed using any suitable number of devices in some embodiments. For example, in some embodiments, multiple devices can be used to implement the functions performed by server 402.

Although two user devices 408 and 410 are shown in FIG. 4 to avoid over-complicating the figure, any suitable number of user devices, and/or any suitable types of user devices, can be used in some embodiments.

Server 402 and user devices 406 can be implemented using any suitable hardware in some embodiments. For example, in some embodiments, server 402 and user devices 406 can be implemented using any suitable general purpose computer or special purpose computer. For example, a mobile phone may be implemented using a special purpose computer. Any such general purpose computer or special purpose computer can include any suitable hardware. For example, as illustrated in example hardware 500 of FIG. 5, such hardware can include hardware processor 502, memory and/or storage 504, an input device controller 506, an input device 508, display/audio drivers 510, display and audio output circuitry 512, communication interface(s) 514, an antenna 516, and a bus 518.

Figure 5:
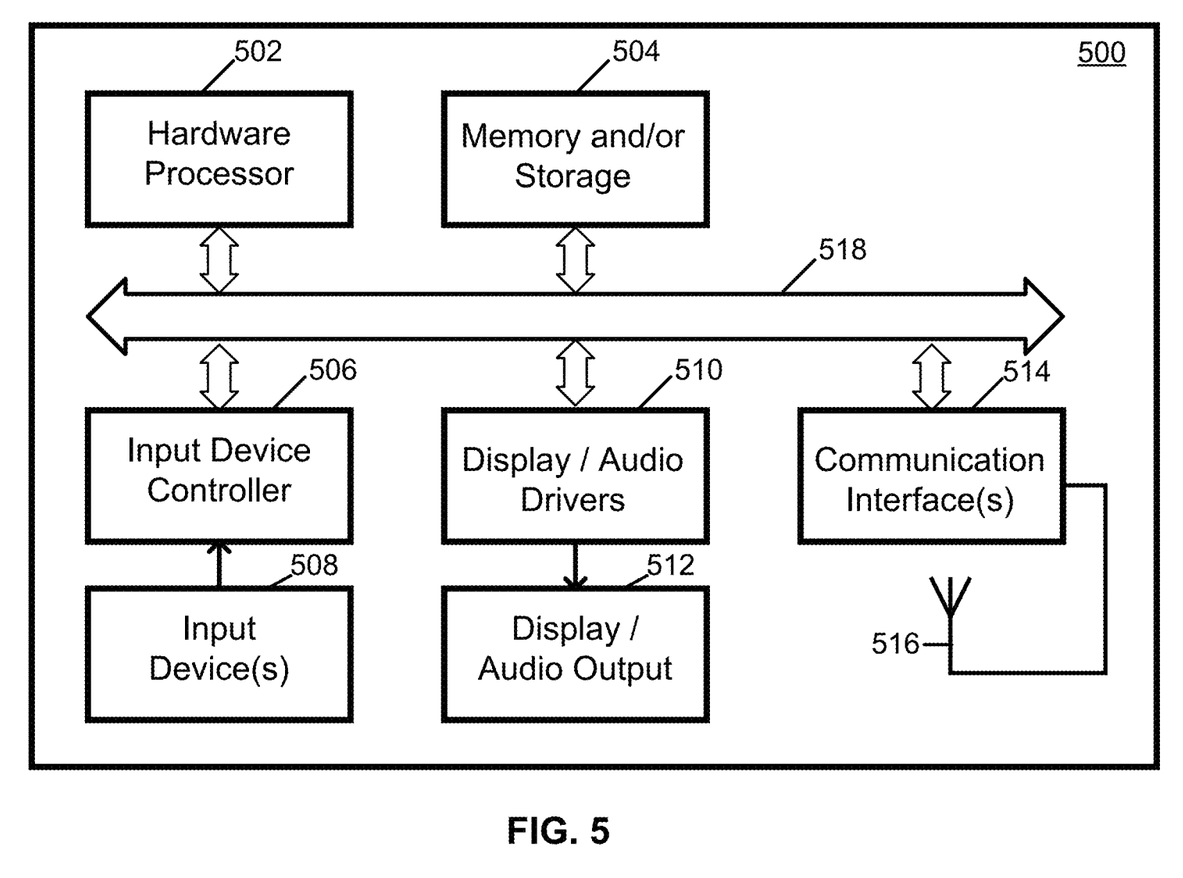
FIG. 5 shows a detailed example of hardware that can be used in a server and/or a user device of FIG. 4 in accordance with some embodiments of the disclosed subject matter.

Hardware processor 502 can include any suitable hardware processor, such as a microprocessor, a micro-controller, digital signal processor(s), dedicated logic, and/or any other suitable circuitry for controlling the functioning of a general purpose computer or a special purpose computer in some embodiments. In some embodiments, hardware processor 502 can be controlled by a server program stored in memory and/or storage of a server, such as server 402. In some embodiments, hardware processor 502 can be controlled by a computer program stored in memory and/or storage 504 of user device 406.

Memory and/or storage 504 can be any suitable memory and/or storage for storing programs, data, and/or any other suitable information in some embodiments. For example, memory and/or storage 504 can include random access memory, read-only memory, flash memory, hard disk storage, optical media, and/or any other suitable memory.

Input device controller 506 can be any suitable circuitry for controlling and receiving input from one or more input devices 508 in some embodiments. For example, input device controller 506 can be circuitry for receiving input from a touchscreen, from a keyboard, from one or more buttons, from a voice recognition circuit, from a microphone, from a camera, from an optical sensor, from an accelerometer, from a temperature sensor, from a near field sensor, from a pressure sensor, from an encoder, and/or any other type of input device.

Display/audio drivers 510 can be any suitable circuitry for controlling and driving output to one or more display/audio output devices 512 in some embodiments. For example, display/audio drivers 510 can be circuitry for driving a touchscreen, a flat-panel display, a cathode ray tube display, a projector, a speaker or speakers, and/or any other suitable display and/or presentation devices.

Communication interface(s) 514 can be any suitable circuitry for interfacing with one or more communication networks (e.g., computer network 404). For example, interface(s) 514 can include network interface card circuitry, wireless communication circuitry, and/or any other suitable type of communication network circuitry.

Antenna 516 can be any suitable one or more antennas for wirelessly communicating with a communication network (e.g., communication network 404) in some embodiments. In some embodiments, antenna 516 can be omitted.

Bus 518 can be any suitable mechanism for communicating between two or more components 502, 504, 506, 510, and 514 in some embodiments.

Any other suitable components can be included in hardware 500 in accordance with some embodiments.

In some embodiments, at least some of the above described blocks of the processes of FIG. 1 can be executed or performed in any order or sequence not limited to the order and sequence shown in and described in connection with the figure. Also, some of the above blocks of FIG. 1 can be executed or performed substantially simultaneously where appropriate or in parallel to reduce latency and processing times. Additionally or alternatively, some of the above described blocks of the process of FIG. 1 can be omitted.

In some embodiments, any suitable computer readable media can be used for storing instructions for performing the functions and/or processes herein. For example, in some embodiments, computer readable media can be transitory or non-transitory. For example, non-transitory computer readable media can include media such as non-transitory forms of magnetic media (such as hard disks, floppy disks, and/or any other suitable magnetic media), non-transitory forms of optical media (such as compact discs, digital video discs, Blu-ray discs, and/or any other suitable optical media), non-transitory forms of semiconductor media (such as flash memory, electrically programmable read-only memory (EPROM), electrically erasable programmable read-only memory (EEPROM), and/or any other suitable semiconductor media), any suitable media that is not fleeting or devoid of any semblance of permanence during transmission, and/or any suitable tangible media. As another example, transitory computer readable media can include signals on networks, in wires, conductors, optical fibers, circuits, any suitable media that is fleeting and devoid of any semblance of permanence during transmission, and/or any suitable intangible media.

Accordingly, methods, systems, and media for simulating movement data of pedestrians in a district are provided.

Although the invention has been described and illustrated in the foregoing illustrative embodiments, it is understood that the present disclosure has been made only by way of example, and that numerous changes in the details of implementation of the invention can be made without departing from the spirit and scope of the invention. Features of the disclosed embodiments can be combined and rearranged in various ways.

What is claimed is:

1. A method for pedestrian movement simulation in districts, the method comprising:
  receiving, using a hardware processor, a district plan for a proposed district;
  determining, using the hardware processor, a number of users that would populate a building in the proposed district;
  generating, using the hardware processor, a population of simulated users based on the determined number of users that would populate the building in the proposed district;
  assigning, using the hardware processor, for the population of simulated users in the building, groups of simulated users in the population of simulated users to a movement category from a plurality of movement categories;
  distributing, using the hardware processor, for the groups of simulated users assigned to each of the plurality of movement categories, a group of simulated users to a first destination within the proposed district that satisfies the movement category by determining a probable walking path from the building to the first destination;
  in response to determining that the first destination within the proposed district has reached a first capacity threshold, distributing, using the hardware processor, remaining users from the group of simulated users to a second destination within the proposed district that satisfies the movement category until at least one of the remaining users in the movement category has been distributed and the second destination within the proposed district has reached a second capacity threshold;
  distributing, using the hardware processor, for the groups of simulated users assigned to each of the plurality of movement categories, trips having the probable walking path of the group of simulated users over time by applying a distribution function to each of the plurality of movement categories; and
  causing, using the hardware processor, a map representation of the proposed district to be presented, wherein the map representation highlights each of the trips having the probable walking path distributed over time to indicate predicted levels of congestion at a particular time in the proposed district.

2. The method of claim 1, wherein the number of users that would populate the building in the proposed district is determined by retrieving unit type information from the received district plan and assigning an estimated unit occupancy for each unit type of the building based on location information associated with the proposed district.

3. The method of claim 1, wherein the number of users that would populate the building in the proposed district is determined by comparing a first set of characteristics associated with the proposed district to sets of characteristics associated with existing districts and assigning the number of users based on an existing district having characteristics similar to the first set of characteristics.

4. The method of claim 1, wherein the movement category includes at least one of a work activity type, a recreational activity type, an errand activity type, and a cultural activity type.

5. The method of claim 1, wherein the group of simulated users are distributed to the first destination within the proposed district using a gravity model that determines a plurality of destinations for each of the plurality of movement categories that the group of simulated users is likely to visit and wherein the first destination is selected from the plurality of destinations based on having a shortest walking path from the building.

6. The method of claim 5, wherein the gravity model retrieves, for the proposed district, geographic information that impacts pedestrian trips and selects the first destination from the plurality of destinations based on the walking path from the building and based on the geographic information that impacts pedestrian trips.

7. The method of claim 1, further comprising assigning a visual characteristic to each user in the group of simulated users for the movement category, wherein the probable walking path of each user in the group of simulated users is indicated on the map representation with the visual characteristic.

8. A system for pedestrian movement simulation in districts, the system comprising:
   a hardware processor that is configured to:
      receives a district plan for a proposed district;
      determines a number of users that would populate a building in the proposed district;
      generates a population of simulated users based on the determined number of users that would populate the building in the proposed district;
      assigns, for the population of simulated users in the building, groups of simulated users in the population of simulated users to a movement category from a plurality of movement categories;
      distributes, for the groups of simulated users assigned to each of the plurality of movement categories, a group of simulated users to a first destination within the proposed district that satisfies the movement category by determining a probable walking path from the building to the first destination;
      in response to determining that the first destination within the proposed district has reached a first capacity threshold, distributes remaining users from the group of simulated users to a second destination within the proposed district that satisfies the movement category until at least one of the remaining users in the movement category has been distributed and the second destination within the proposed district has reached a second capacity threshold;
      distributes, for the groups of simulated users assigned to each of the plurality of movement categories, trips having the probable walking path of the group of simulated users over time by applying a distribution function to each of the plurality of movement categories; and
      causes a map representation of the proposed district to be presented, wherein the map representation highlights each of the trips having the probable walking path distributed over time to indicate predicted levels of congestion at a particular time in the proposed district.

9. The system of claim 8, wherein the number of users that would populate the building in the proposed district is determined by retrieving unit type information from the received district plan and assigning an estimated unit occupancy for each unit type of the building based on location information associated with the proposed district.

10. The system of claim 8, wherein the number of users that would populate the building in the proposed district is determined by comparing a first set of characteristics associated with the proposed district to sets of characteristics associated with existing districts and assigning the number of users based on an existing district having characteristics similar to the first set of characteristics.

11. The system of claim 8, wherein the movement category includes at least one of a work activity type, a recreational activity type, an errand activity type, and a cultural activity type.

12. The system of claim 8, wherein the group of simulated users are distributed to the first destination within the proposed district using a gravity model that determines a plurality of destinations for each of the plurality of movement categories that the group of simulated users is likely to visit and wherein the first destination is selected from the plurality of destinations based on having a shortest walking path from the building.

13. The system of claim 12, wherein the gravity model retrieves, for the proposed district, geographic information that impacts pedestrian trips and selects the first destination from the plurality of destinations based on the walking path from the building and based on the geographic information that impacts pedestrian trips.

14. The system of claim 8, wherein the hardware processor is further configured to assign a visual characteristic to each user in the group of simulated users for the movement category, wherein the probable walking path of each user in the group of simulated users is indicated on the map representation with the visual characteristic.

15. A non-transitory computer-readable medium containing computer executable instructions that, when executed by a processor, cause the processor to perform a method for pedestrian movement simulation in districts, the method comprising:
   receiving a district plan for a proposed district;
   determining a number of users that would populate a building in the proposed district;
   generating a population of simulated users based on the determined number of users that would populate the building in the proposed district;
   assigning, for the population of simulated users in the building, groups of simulated users in the population of simulated users to a movement category from a plurality of movement categories;
   distributing, for the groups of simulated users assigned to each of the plurality of movement categories, a group of simulated users to a first destination within the proposed district that satisfies the movement category by determining a probable walking path from the building to the first destination;

in response to determining that the first destination within the proposed district has reached a first capacity threshold, distributing remaining users from the group of simulated users to a second destination within the proposed district that satisfies the movement category until at least one of the remaining users in the movement category has been distributed and the second destination within the proposed district has reached a second capacity threshold;

distributing, for the groups of simulated users assigned to each of the plurality of movement categories, trips having the probable walking path of the group of simulated users over time by applying a distribution function to each of the plurality of movement categories; and causing a map representation of the proposed district to be presented, wherein the map representation highlights each of the trips having the probable walking path distributed over time to indicate predicted levels of congestion at a particular time in the proposed district.

16. The non-transitory computer-readable medium of claim 15, wherein the number of users that would populate the building in the proposed district is determined by retrieving unit type information from the received district plan and assigning an estimated unit occupancy for each unit type of the building based on location information associated with the proposed district.

17. The non-transitory computer-readable medium of claim 15, wherein the number of users that would populate the building in the proposed district is determined by comparing a first set of characteristics associated with the proposed district to sets of characteristics associated with existing districts and assigning the number of users based on an existing district having characteristics similar to the first set of characteristics.

18. The non-transitory computer-readable medium of claim 15, wherein the movement category includes at least one of a work activity type, a recreational activity type, an errand activity type, and a cultural activity type.

19. The non-transitory computer-readable medium of claim 15, wherein the group of simulated users are distributed to the first destination within the proposed district using a gravity model that determines a plurality of destinations for each of the plurality of movement categories that the group of simulated users is likely to visit and wherein the first destination is selected from the plurality of destinations based on having a shortest walking path from the building.

20. The non-transitory computer-readable medium of claim 19, wherein the gravity model retrieves, for the proposed district, geographic information that impacts pedestrian trips and selects the first destination from the plurality of destinations based on the walking path from the building and based on the geographic information that impacts pedestrian trips.

21. The non-transitory computer-readable medium of claim 15, wherein the method further comprises assigning a visual characteristic to each user in the group of simulated users for the movement category, wherein the probable walking path of each user in the group of simulated users is indicated on the map representation with the visual characteristic.

* * * * *